Figure 1:
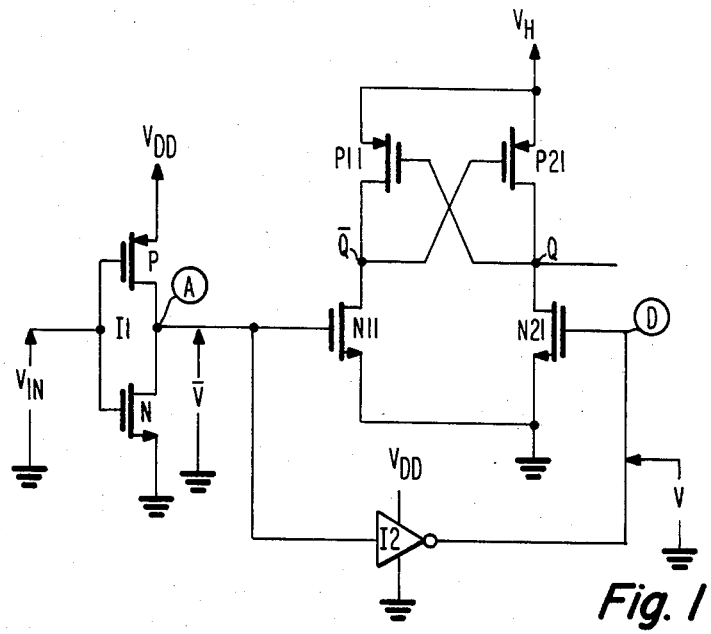

United States Patent [19]

Plus

[11] Patent Number: 4,656,373
[45] Date of Patent: Apr. 7, 1987

[54] HIGH-SPEED VOLTAGE LEVEL SHIFT CIRCUIT

[75] Inventor: Dora Plus, Borough of South Bound Brook, N.J.

[73] Assignee: RCA Corporation, Princeton, N.J.

[21] Appl. No.: 674,845

[22] Filed: Nov. 26, 1984

[51] Int. Cl.[4] .................. H03K 17/10; H03K 17/687; H03K 19/094; H03K 3/027
[52] U.S. Cl. ..................... 307/475; 307/264; 307/451; 307/279; 307/585; 365/226
[58] Field of Search ............... 307/264, 475, 270, 290, 307/279, 450, 451, 576, 579, 585, 605; 365/104, 226

[56] References Cited

U.S. PATENT DOCUMENTS

| | | | |
|---|---|---|---|
| 4,185,209 | 1/1980 | Street | 307/451 X |
| 4,216,390 | 8/1980 | Stewart | 307/264 |
| 4,321,491 | 3/1982 | Atherton et al. | 307/279 X |
| 4,451,745 | 5/1984 | Itoh et al. | 307/475 |
| 4,486,670 | 12/1984 | Chan et al. | 307/279 X |
| 4,555,642 | 11/1985 | Morales | 307/585 X |
| 4,555,644 | 11/1985 | Devecchi et al. | 307/450 X |
| 4,571,504 | 2/1986 | Iwamoto et al. | 307/579 X |

FOREIGN PATENT DOCUMENTS 0140188  5/1985  European Pat. Off. ............ 307/450

OTHER PUBLICATIONS

Erdelyi, "Low Power Inverter Driver Circuit", IBM Tech. Discl. Bull., vol. 23, No. 8, p. 3600, Jan. 1981.

*Primary Examiner*—Stanley D. Miller
*Assistant Examiner*—David R. Bertelson
*Attorney, Agent, or Firm*—Joseph S. Tripoli; Henry I. Schanzer

[57] ABSTRACT

An input signal translating circuit includes first and second transistors having their conduction paths connected in series between a first power terminal and an output node, and a third transistor whose conduction path is connected between the output node and a second power terminal. The circuit includes means for applying an input signal to the control electrodes of the first and third transistors for turning one on and the other off for one value of the input signal and turning the one off and the other on for another value of input signal. Means responsive to the signal produced at the output node generate a delayed negative feedback signal which is applied to the control electrode of the second transistor for turning-it-off after the voltage at said output node is at, close to, or greater than, the voltage applied to the first power terminal and for turning-it-on after the voltage at said output node is at, or close to, the voltage at the second power terminal.

10 Claims, 7 Drawing Figures

HIGH-SPEED VOLTAGE LEVEL SHIFT CIRCUIT

This invention relates to switching circuits which are particularly useful in level shift applications.

It is often necessary and/or desirable to operate different parts of an electronic system at different voltage levels. At the places where the different parts interface, they must be coupled to each other. However, the signals at the interfaces are not necessarily compatible. It is, therefore, necessary to provide interface and level shift circuits which can render one part of the system compatible with the other. For an interface or level shift circuit to be useful, it must be compatible with the other circuits of the system with respect to speed of operation, and minimization of power dissipation, among other things.

A prior art level shift circuit shown in FIG. 1 includes an input inverter I1 operated between $V_{DD}$ volts and ground. In response to an input signal $V_{IN}$ applied to its input, inverter I1 produces a signal $\overline{V}$ at its output. The complementary signals $V_{IN}$ and $\overline{V}$ are applied to the gates of transistors N11 and N21 whose sources are grounded. The drain of N11 is connected to the drain of transistor P11 and to the gate of a transistor P21 at an output node designated $\overline{Q}$ and the drain of N21 is connected to the drain of P21 and the gate of P11 at an output node designated Q, whereby N11, P11 and N21, P21 form two level shift inverters. P11 and P21, which function as the load devices of the level shift inverters, have their sources returned to a high voltage potential source, $V_H$. A problem with the circuit of FIG. 1 is that to effectively switch the output nodes (Q and $\overline{Q}$) from high-to-low, the "ON" impedance ($Z_{ON}$) of the load transistors (P11, P21) must be significantly greater than the $Z_{ON}$ of the driving (input) transistors (N11, N21). By way of example, assume that $V_{IN}$ is low and $\overline{V}$ is high and hence that N11 is on and N21 is off. With N11 on, $\overline{Q}$ is clamped to ground, P21 is turned-on clamping Q to $V_H$ volts and P11 is turned off. Assume now that $V_{IN}$ goes high and $\overline{V}$ goes low tending to turn-off N11 and turn-on N21. However, when N21 is turned-on trying to clamp node Q to ground, P21 is still on fighting the effect of N21. Before any change can occur, N21 must overpower P21 which is fully on. To ensure proper operation, the $Z_{ON}$ of N11 and N21 must be made significantly smaller than the $Z_{ON}$ of their load devices P11 and P21. However, if the $Z_{ON}$ of P11 and P21 is made large, the time for P11 and P21 to charge their respective output nodes (Q or $\overline{Q}$) towards $V_H$ is increased and the circuit responds slowly. Thus, in the circuit of FIG. 1, the $Z_{ON}$ of the load devices must be made larger than the $Z_{ON}$ of the driving transistors for the circuit to function. However, the $Z_{ON}$ of the load devices cannot be made too large or else the circuit will be too slow. Thus, in the circuit of FIG. 1, the ratio of the $Z_{ON}$ of the load devices (P11, P21) to the $Z_{ON}$ of the driving transistors (N11, N21) must be controlled relatively tightly. This renders the manufacture and performance of the circuit of FIG. 1 problematic since the values of the impedances are subject to many processing and operating variations.

Figure 2:
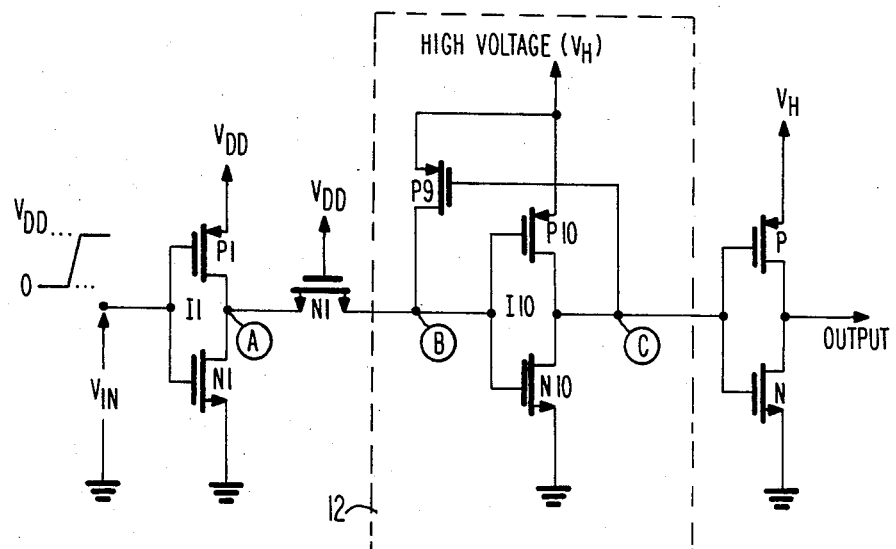

The "ratio'ing" problem present in the circuit of FIG. 1 is resolved in the prior art level shift circuit shown in FIG. 2. The circuit of FIG. 2 includes an inverter I1, operated between ground (i.e., zero volts) and $V_{DD}$ volts (e.g. 5 volts) which is responsive to an input signal ($V_{IN}$) and a single transistor transmission gate, N1, for coupling the output (node A) of inverter I1 to the input (node B) of a half-latch circuit 12 comprised of an inverter I0 with positive feedback provided by a transistor P9. The half-latch 12 is operated between zero volts and a high voltage supply of $V_H$ volts where $V_H$ may range between 5 and 20 volts. The gating transistor N1 is needed to isolate the input inverter I1 from the latch circuit 12 when the latter generates a $V_H$ level signal at node B. The gate electrode of N1 is connected, or switched, to $V_{DD}$ volts to ensure that if, and when, the voltage at node B rises above $V_{DD}$ volts, such voltage rise is not coupled back into input inverter I1 and via inverter I1 into the $V_{DD}$ supply source.

A problem with the circuit of FIG. 2 is that the gating transistor N1 is used to pass both the $V_{DD}$ ("high" or logic "1") and the zero volts ("low" or logic "0") signal levels. When passing the "low" level signal produced at node A, N1 conducts in the common source mode and functions to clamp node B to ground very effectively. However, when passing the "high" level signal produced at node A, N1 conducts in the source follower mode. When conducting in the source follower mode, N1 can only charge node B exponentially towards $V_{DD}$, and the circuit response is slow. Also, with N1 operating in the source follower mode, the minimum operating voltage, $V_{DD}$, must be at least equal to two threshold voltage drops (i.e. $V_{DD} \geq 2V_T$), for proper operation. For example, $V_{DD}$ must then equal, or exceed, the threshold voltages of N1 and N10. Thus, the source follower operation of N1 results in slower circuit response and requires a higher operating voltage for proper operation. The problems resulting from the source follower action of FIG. 2 and from the need to tightly control the ratio of the impedances of the devices as in FIG. 1 are eliminated in circuits embodying the invention.

Circuits embodying the invention include first and second transistors having their conduction paths connected in series between a first power terminal and an output node, and a third transistor whose conduction path is connected between the output node and a second power terminal. The circuit includes means for applying an input signal to the control electrodes of the first and third transistors for turning one on and the other off for one value of the input signal and turning the one off and the other on for another value of input signal. Means responsive to the signal produced at the output node generate a delayed negative feedback signal which is applied to the control electrode of the second transistor for turning-it-off after the voltage at said output node is at, close to, or greater than, the voltage applied to said first power terminal and for turning-it-on after the voltage at said output node is at, or close to, the voltage at said second power terminal.

Figure 3:
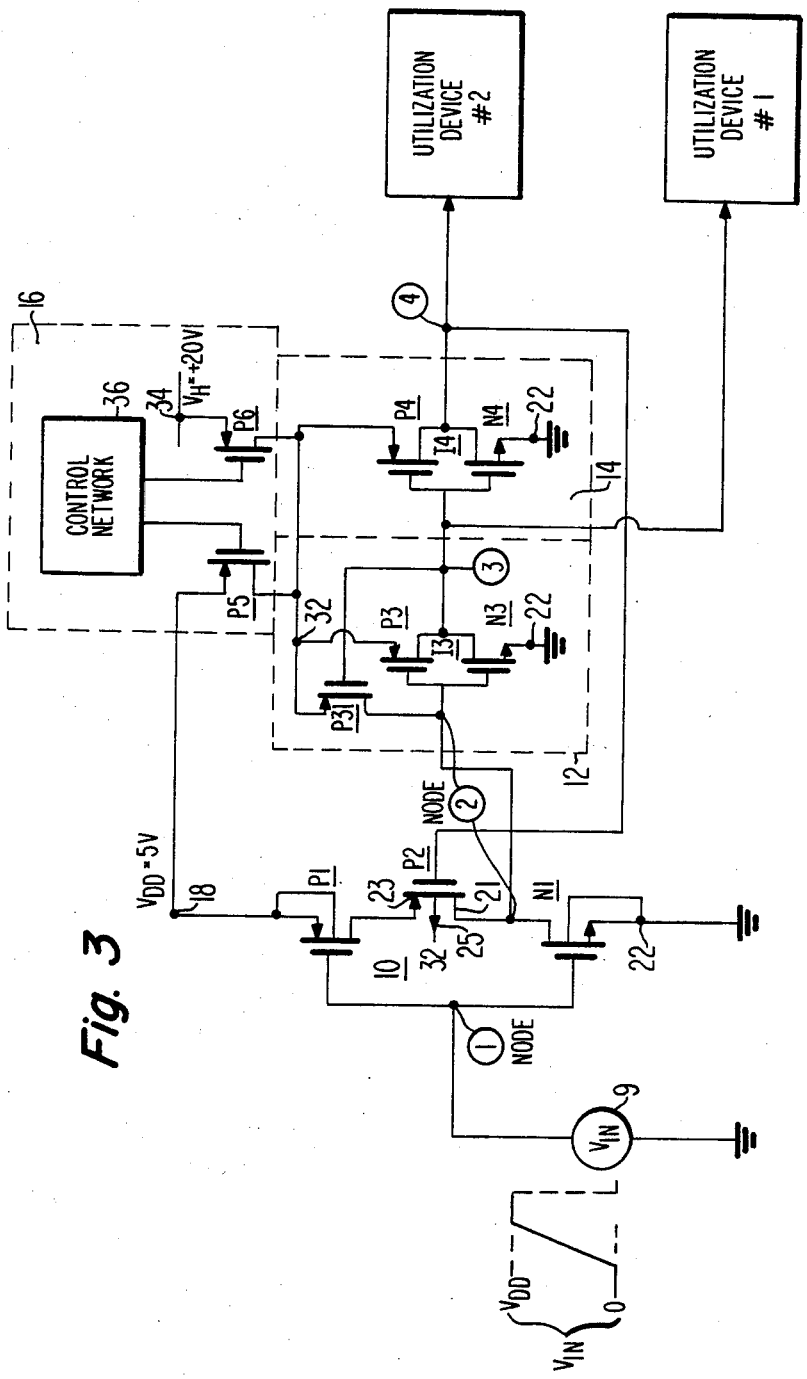

The invention is best understood and explained with reference to the accompanying drawings in which like reference characters denote like components, in which enhancement mode insulated-gate field-effect transistors (IGFETs) are used to illustrate the invention and in which IGFETs of P-conductivity type are identified by the letter P followed by a reference numeral, and IGFETs of N-conductivity type are identified by the letter N followed by a reference numeral; and in which FIGS. 1 and 2 are schematic diagrams of prior art circuits; FIG. 3 is a schematic diagram of a circuit embodying the invention; and FIGS. 4 through 7 are diagrams of other circuits embodying the invention.

The circuit of FIG. 3 includes an input signal translating circuit 10, a half latch circuit 12, an inverting means 14, and a control circuit 16 for selectively changing the operating potential applied to latch 12 and inverter 14.

A signal source 9 producing input signals ($V_{IN}$) varying between zero volts and $V_{DD}$ volts is applied to the input of an input signal translating circuit 10 at node 1. Circuit 10 includes IGFETs P1 and P2 having their conduction paths connected in series between a power terminal 18 and a signal output node 2. A voltage of $V_{DD}$ volts which, by way of example, may be assumed to be +5 volts is applied to terminal 18. The conduction path of an IGFET N1 is connected between node 2 and power terminal 22 which is returned to ground potential, (i.e. zero volts). The gate electrodes of P1 and N1 are connected to node 1. The gate electrode of P2 is connected to node 4 which is the output of inverting means 14. The substrate of P1 is returned to $V_{DD}$ volts, the substrate of N1 is returned to ground potential, and the substrate 25 of P2 is returned to terminal 32 to prevent conduction through its source-to-substrate and drain-to-substrate diodes, as discussed below.

Half latch 12 has a signal input terminal connected to node 2, a signal output terminal connected to node 3, and is powered by the operating potential applied between power terminals 22 and 32. In FIG. 3, terminal 22 is grounded, and an operating voltage which may be varied between $V_{DD}$ volts and $V_H$ volts is applied to terminal 32, as described below. Latch 12 includes a complementary inverter I3 comprised of IGFETs P3 and N3 whose gates are connected to node 2 and whose drains are connected to node 3. The source electrodes of P3 and N3 are respectively connected to terminals 32 and 22. Latch 12 also includes an IGFET P31 connected at its gate to node 3, at its source to terminal 32, and at its drain to node 2 to provide positive feedback to node 2 when the output of inverter I3 is at, or close to, the potential at terminal 22 (i.e., ground potential). The "ON" impedance of the conduction path of feedback IGFET P31 is significantly greater (typically, more than 10 times greater) than the ON impedance of the conduction paths of the other IGFETs of the circuit.

The inverting means 14 includes a complementary inverter I4 which is comprised of IGFETs P4 and N4. The gates of P4 and N4 which define the signal input of inverter I4 are connected to node 3. The drains of P4 and N4 which define the signal output of inverter I4 are connected to node 4. The source electrode of P4 is returned to power terminal 32 and the source electrode of N4 is returned to power terminal 22.

The operating voltage applied to terminal 32 is varied by means of IGFETs P5 and P6. IGFET P5 has its source-drain path connected between terminals 18 and 32. IGFET P6 has its source-drain path connected between node 32 and a power terminal 34 to which is applied a third operating voltage $V_H$ which, by way of example, is 20 volts. The gate electrodes of P5 and P6 are connected to a control network 36 which controls their turn-on and turn-off. Control network 36 is designed to selectively apply either a voltage of $V_H$ volts to the gate of P5 to turn-it-off or a voltage of zero volts to turn-it-full-on. Similarly, control network 36 is designed to apply either a voltage of $V_H$ volts to the gate of P6 to turn-it-off or a voltage of zero volts to turn-it-on. Typically, P5 and P6 may both be off at the same time but only one of them will be turned-on at any one time. When P5 is turned-on, $V_{DD}$ volts are applied to terminal 32. When P6 is turned on, $V_H$ volts are applied to terminal 32.

The operating voltage applied to terminal 32 is selectively raised from $V_{DD}$ volts to $V_H$ volts to generate voltages (of $V_H$ volts or zero volts) at nodes 3 and 4 which are then applied to utilization devices. By way of example, these utilization devices are memory arrays such as electrically programmable read only memories (EPROMs) which require a high voltage during a programming cycle.

In the discussion of the operation of the circuit of FIG. 3, to follow, it is assumed that when the input signal ($V_{IN}$) makes a transition from high-to-low or low-to-high, the same operating voltage ($V_{DD}$ volts) is applied to input translating circuit 10 and to the half latch 12 and inverter I4. After an input signal transition has propagated through the circuit and the circuit nodes have been set to their new levels (i.e. after $V_{IN}$ going from high-to-low has caused the potential, V4, at node 4 to go high, or $V_{IN}$ going from low-to-high has caused V4 to go low) the operating voltage across latch 12 and inverter I4 is raised from $V_{DD}$ to $V_H$ volts. Typically, the propagation time (or delay) through the 3 stages (i.e. 10, 12 and 14) is approximately three (3) nanoseconds. Following this propagation delay, the operating potential applied to latch 12 and inverter 14 is increased by turning-off P5 and turning-on P6.

The transfer of information from node 1 into latch 12 and inverter I4 will now be discussed.

Assume first that $V_{IN}$ makes a transition from a "low" level (i.e. at, or close to, zero volts) to a "high" level (i.e. at, or close to, $V_{DD}$ volts). As $V_{IN}$ rises above the threshold voltage ($V_T$) of transistor N1, N1 turns-on. [For ease of discussion it is assumed that the $V_T$ of the P and N devices are approximately equal and that $V_T$ is approximately 1 volt.] When $V_{IN}$ first goes from low-to-high, P2 is OFF and P31 is ON. P31 is ON and P2 is OFF because when $V_{IN}$ was previously at the "low" level it caused node 3 to be driven "low" and node 4 to be driven "high". Although P31 is ON and conducting a current into node 2 its "ON" impedance is very high relative to the ON impedance of N1. Thus, as soon as N1 begins to conduct, N1 can easily and quickly pull node 2 down to ground potential. [Unlike the load devices in the prior art circuit, P31 can be made a very high impedance device since it is only needed to maintain node 2 high once node 2 is already high; that is, P31 is not needed to drive node 2 high.] Since P2 is OFF and since P31 has a very high "ON" impedance, as soon as $V_{IN}$ rises above $V_T$ volts N1 starts to conduct and node 2 is easily and quickly pulled down towards ground potential.

As $V_{IN}$ rises further above $V_T$ volts and comes within a threshold voltage of $V_{DD}$ volts, P1 is turned-off and N1 is then fully ON and clamps node 2 to ground potential (even if P2 turns-on, subsequently).

As the potential (V2) at node 2 goes "low", P3 is turned-on and N3 is turned-off causing the potential (V3) at node 3 to go "high" (i.e. to the voltage at terminal 32). When V3 goes "high", P31 is turned-off. Concurrently, P4 is turned-off and N4 is turned-on causing the potential V4 at node 4 to go "low" (i.e. to the zero volts at node 22).

The "low" at node 4 is fed back to the gate of P2 and turns-it-on. However, note that by the time P2 is turned-on, node 2 is "low" and P1 is either fully off or mostly off, whereby node 2 remains at, or close to, the "low" (i.e. zero voltage) level after P2 turns-on.

As soon as the appropriate logic condition has been established at node 4 (which condition occurs several nanoseconds after $V_{IN}$ has made a transition from low to high) the control network 36 switches turning-off P5 and turning-on P6. [The switching of control network 36 may be accomplished by controls (not shown) which are external to the circuit of FIG. 3. These controls may be respoonsive to preselected timing pulses or to signals fed back from the utilization devices.] The turn-on of P6 applies $V_H$ volts (e.g. 20 volts) to terminal 32. The positive voltage step applied to terminal 32 does not alter the logic state of latch 12 and inverter I4. However, the logic "1" level at nodes 2, 3 and 4 is now at, or close to, 20 volts rather than 5 volts, while the logic "0" level remains at 0 volts. With node 2 held "low" by N1 which is ON, P3 remains ON and N3 remains OFF with node 3 driven from $V_{DD}$ (e.g. 5v) to $V_H$ (e.g. 20 volts). Therefore, P31 remains turned-off and clearly node 2 remains undisturbed at, or close to, zero volts. The $V_H$ voltage applied to node 3 ensures that P4 remains turned-off and N4 is turned-on whereby node 4 remains at, or close to, zero volts and P2 remains turned-on but non-conducting since P1 is turned-off. It has thus been shown that the operating potential across latch 12 and inverter I4 can be raised without altering the logic state of the circuit. Thus with $V_{IN}$ at a "high" level equal to $V_{DD}$, node 2 is at a "low" level equal to ground, node 3 is at a "high" level equal to $V_H$ volts and V4 is at a "low" level equal to ground. The "high" level at node 3 has thus been level shifted from $V_{DD}$ volts to $V_H$ volts.

Note that P2 with zero volts applied to its gate remains ready to conduct. However, since P1 is turned-off there is no conduction through the series conduction paths of P1 and P2. Hence, N1 keeps node 2 at, or close to, ground potential.

Assume now that P6 has been turned-off and that P5 is again turned-on applying $V_{DD}$ volts to terminal 32. Assume also that $V_{IN}$ makes a transition from high ($V_{DD}$)-to-low (ground). As soon as $V_{IN}$ drops $V_T$ volts below $V_{DD}$ volts, P1 conducts. Recall that P2 is turned on and ready to conduct since node 4 is low due to the previous condition of $V_{IN}$-high. Note also that V4 will remain low and P2 will remain ON until the high-to-low signal transition is propagated through the circuit. As $V_{IN}$ drops further below ($V_{DD}-V_T$) volts P1 turns-on more while the conductivity of N1 decreases. Consequently, the potential V2 at node 2 rises towards $V_{DD}$ volts causing N3 to turn-on and P3 to turn-off. This causes V3 at node 3 to go to, or close to, ground potential, turning-on P31 which provides positive feedback to node 2 hastening the further turn-on of N3 which increases the drive of node 3 towards ground. This causes latch 12 to go quickly to its stable state in which node 2 is driven "high" and node 3 is driven low. In response to the "low" produced at node 3, N4 is turned-off and P4 is turned-on producing a "high" level voltage of $V_{DD}$ volts at node 4 turning-off P2.

Although P1 is turned-on, the turn-off of P2 decouples P1 from the input of latch 12. However, it is evident that, for P2 to be turned-off, the input signal condition corresponding to $V_{IN}$ being low (or having gone low) has been transferred to latch 12 and is statically stored in latch 12 with node 2 driven high and node 3 driven low.

The transfer of data within the circuit is very rapid and may take only several nanoseconds (e.g. 2.5 to 4 nanoseconds) as noted above. After the transfer of the new data bit through the circuit, with $V_{IN}$ low, V2 is at a "high" of $V_{DD}$ volts, V3 is at a low of 0 volts and V4 is at a "high" of $V_{DD}$ volts.

Assume now that the operating voltage across the latch and inverter I4 is increased by turning-off P5 and turning-on P6 after the input signal transition has propagated through the circuit and P2 is turned-off. As demonstrated below the logic state of the circuit is in no way altered by the increase in the operating voltage. When the operating voltage at terminal 32 is raised from $V_{DD}$ volts to $V_H$ volts, the voltages at nodes 2 and 4 are raised from a high of $V_{DD}$ volts to a high of $V_H$ volts while the voltages at nodes 1 and 3 remain at, or close to, zero volts.

The high voltage $V_H$ applied to latch 12 is coupled via P31 to node 2 whereby node 2 is raised from $V_{DD}$ volts to $V_H$ volts. Thus, node 2 remains logically "high" with the "high" level now being $V_H$ (e.g. 20 volts) volts rather than $V_{DD}$ (e.g. 5 volts). $V_H$ applied to node 2 causes P3 to remain turned-off and N3 to remain turned-on with node 3 remaining at, or close to, zero volts. With V3 remaining "low" N4 remains turned-off and P4 turned-on whereby the $V_H$ volts is coupled to node 4 and applied to the gate of P2. P2 with $V_H$ volts applied to its gate electrode remains turned-off. Note that now $V_H$ volts are applied to electrode 21 of P2 which is connected to node 2. Electrode 21 now functions as the source electrode of P2. But since $V_H$ volts are also applied to the gate of P2, it is turned-off. Thus there can be no conduction via the conduction path of P2 into P1 and into the voltage source, supplying the $V_{DD}$ voltage, connected to terminal 18. Note that it is for this signal condition (i.e. when $V_H$ volts is applied to node 2 and to electrode 21 of P2) that the substrate 25 of P2 must be returned to terminal 32 which is now at, or close to, $V_H$ volts. With the substrate 25 at $V_H$ volt, there can be no conduction between the "parasitic" diode formed between the source-(21)-and-substrate-(25) regions.

Clearly, the voltage levels at nodes 2 and 4 have been level shifted from $V_{DD}$ volts to $V_H$ volts without impediment.

In the circuit of FIG. 3 where a signal is coupled between first (i.e. 10) and second circuits (i.e. 12, 14) and where the second circuit is operated at a higher operating potential than the first circuit, it has been shown that the problem of blocking or preventing the higher operating potential from being fed back to the first circuit is resolved by means of a unique signal translating circuit (i.e. 10) which does not require source follower action and/or highly ratioed devices for proper operation.

Figure 4:
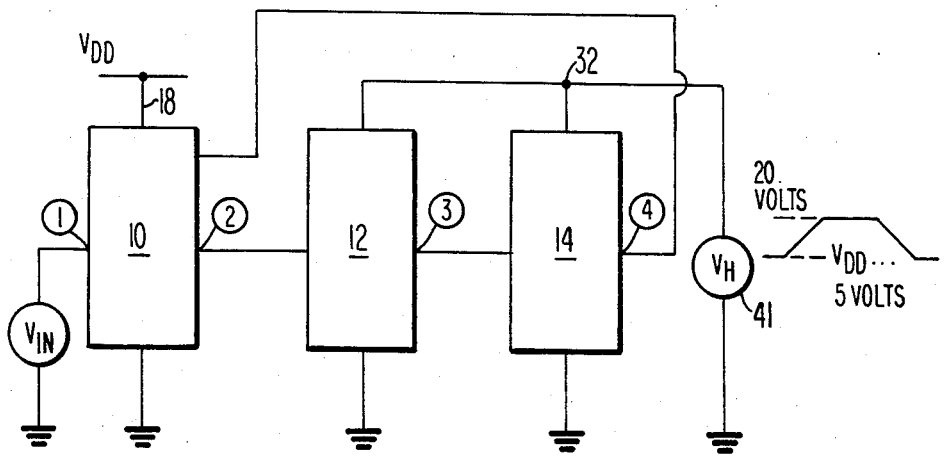

The circuit of FIG. 4 shows that the potential ($V_H$) applied to terminal 32 may be produced by a source 41 which causes the voltage to be selectively ramped up from $V_{DD}$ (e.g. 5 volts) volts to $V_H$ volts and then ramped down from $V_H$ to $V_{DD}$ volts. [The ramping of $V_H$ may be accomplished by circuitry (not shown) which is responsive to preselected timing pulses and/or to signals resonsive to the input signal ($V_{IN}$) transition.] Ramping the voltages as shown in FIG. 4 may be preferred to the switching shown in FIG. 3 in order to reduce switching transients and the chances of upsetting the circuit.

In the circuits of FIGS. 3 and 4, the operating voltage applied to terminal 32 has been varied between $V_{DD}$ volts and $V_H$ volts. However, it should be noted that these circuits function even when $V_H$ volts is permanently applied to terminal 32.

Figure 5:
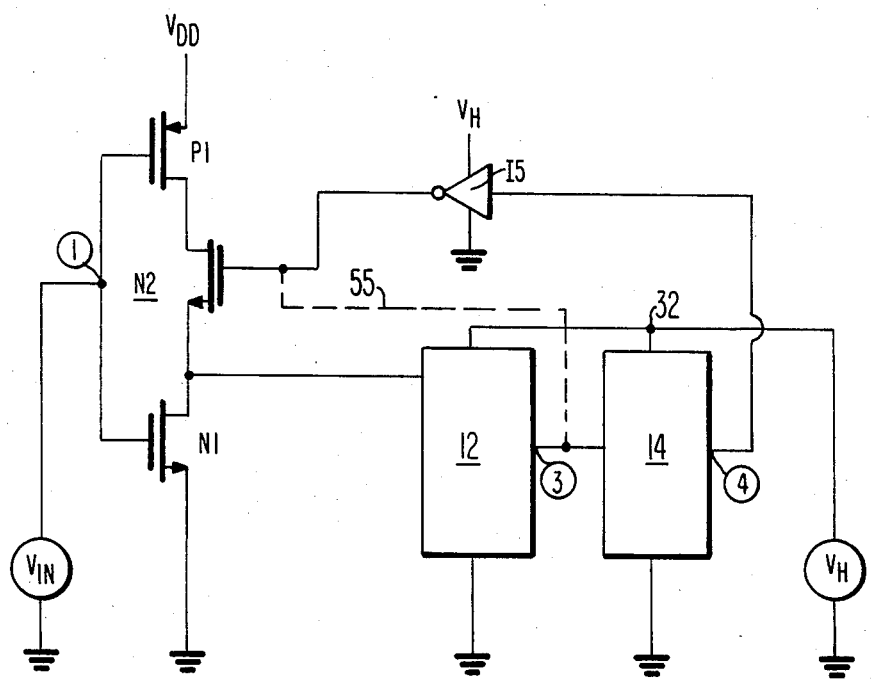

Furthermore, as shown in FIG. 5, where the voltages applied to terminal 32 are always held at $V_H$ volts, P2 may be replaced with an N-type device whose gate is driven by an inverter I5 whose input is connected to node 4. Alternatively, the gate of N2 could be driven directly from node 3 by means of a connection 55 and elements I4 and I5 could be eliminated.

Admittedly, in the circuit of FIG. 5, N2 would conduct in the source follower mode for the condition of $V_{IN}$ going from high-to-low. However, when that occurs, the drain-to-source path of N2 would be passing a $V_{DD}$ voltage while its gate would be driven by $V_H$ volts. Where $V_H$ is several volts greater than $V_{DD}$ the gate would be overdriven. Although N2 would be conducting in the source follower mode, the overdrive applied to the gate obviates the deleterious effect normally associated with source follower action where the gate and drain of the transistor are at the same potential and the source is being driven to the same potential as the gate and drain.

Figure 6:
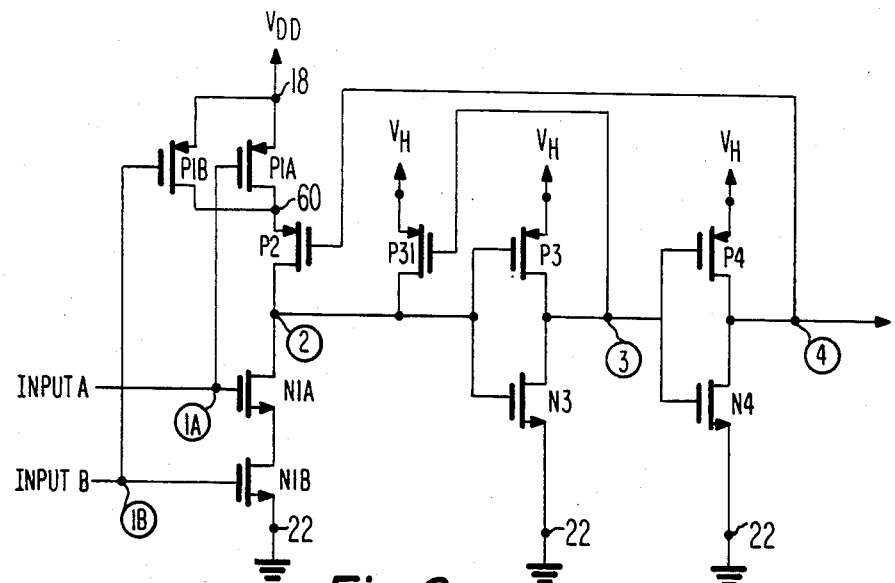

The circuit of FIG. 6 illustrates that the input translating circuit of the invention may incorporate the NAND function. Thus the conduction paths of IGFETs P1A and P1B may be connected in parallel between terminals 18 and 60 with IGFET P2 connected between terminal 60 and node 2. The conduction paths of IGFETs N1A and N1B are connected in series between node 2 and terminal 22 while the gates of P1A and N1A are connected to input terminal 1A and the gates of P1B and N1B are connected to input terminal 1B. The operation of the NAND gate portion of the circuit is well known in the art and need not be detailed, and the operation of the remainder of the circuit has already been described above.

Figure 7:
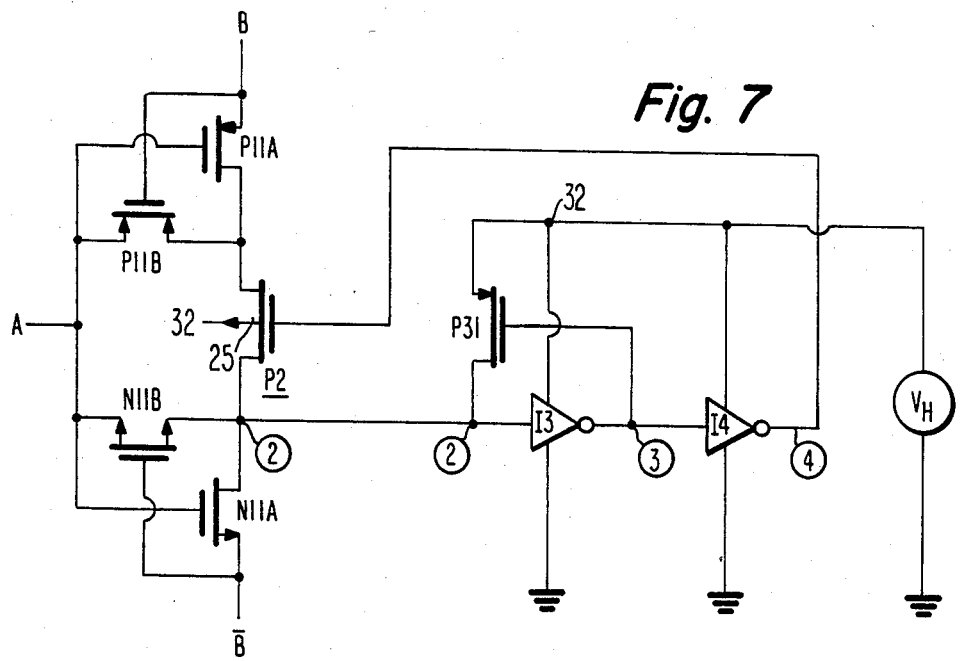

The circuit of FIG. 7 illustrates that the circuit of the invention may be used in combination with an exclusive OR gate to obtain and generate a level shifting of the input signals. The invention may be used in combination with many other logic and input circuits, FIGS. 6 and 7 being only two examples of such use.

What is claimed is:

1. The combination comprising:
   first and second power terminals for the application thereto of first and second different operating voltages, respectively;
   a first node for the application thereto of signals varying in amplitude between said first and said second operating voltages;
   first, second and third transistors, each transistor having a conduction path and a control electrode for controlling the conductivity of said conduction path;
   a second node for the production thereat of an output signal;
   means connecting the control electrodes of said first and third transistors to said first node;
   means connecting the conduction path of said third transistor between said second node and said first power terminal;
   means connecting the conduction paths of said first and second transistors in series between said second node and said second power terminal; and
   means responsive to the signal produced at said second node for generating a delayed negative feedback signal and for applying said delayed negative feedback signal to the control electrode of said second transistor for:
   (a) turning-it-off and preventing current flow therethrough after the voltage at said second node is at, close to, or greater than, the voltage applied to said second power terminal; and
   (b) turning-it-on and enabling current conduction therethrough after the voltage at said second node is at, or close to, the voltage at said first power terminal.

2. The combination as claimed in claim 1 wherein said first and second transistors are of one conductivity type and said third transistor is of complementary conductivity type.

3. The combination as claimed in claim 1 wherein said first transistor is of one conductivity type and second and third transistors are of complementary conductivity type.

4. The combination as claimed in claim 2 wherein said means responsive to the signal produced at said signal output node for generating and applying a delayed negative feedback signal to the control electrode of said second transistor includes:
   (a) a third power terminal for the application thereto of an operating potential outside the range of the potential applied between said first and second power terminals;
   (b) a latch circuit operatively connected between said first and third power terminals, said latch including an inverter connected at its signal input to said second node and connected at its output to a third node; said latch further including a feedback transistor having its conduction path connected between said third power terminal and said second node and having its control electrode connected to said third node; and
   (c) an inverting means operatively connected between said first and third power terminals and having a signal input connected to said third node and having a signal output connected to said control electrode of said second transistor.

5. The combination as claimed in claim 1 further including a fourth transistor of same conductivity type as said first transistor and a fifth transistor of same conductivity type as said third transistor, each one of said fourth and fifth transistors having a control electrode and a conduction path;
   means connecting the conduction path of said fourth transistor in parallel with that of said first transistor;
   a second input node;
   means connecting the control electrodes of said fourth and fifth transistors to said second input node; and
   wherein said means connecting the conduction path of said third transistor between said second node and said first power terminal includes the conduction path of said fifth transistor.

6. The combination comprising:
   first and second power terminals for the application thereto of first and second different operating voltages, respectively;
   a signal input terminal for the application thereto of signals varying in amplitude between said first and said second operating voltages;
   first and second transistors of one conductivity type and a third transistor of second conductivity type, each transistor having a conduction path and a control electrode for controlling the conductivity of said conduction path;

a first signal output node;

means connecting the control electrodes of said first and third transistors to said signal input terminal;

means connecting the conduction path of said third transistor between said first signal output node and said first power terminal;

means connecting the conduction paths of said first and second transistors in series between said second power terminal and said first signal output node; and means responsive to the signal produced at said first signal output node for generating and applying a delayed negative feedback signal to the control electrode of said second transistor for turning-it-off after the voltage at said output node is at, close to, or greater than, the voltage applied to said second power terminal and for turning-it-on after the voltage at said output node is at, or close to, the voltage at said first power terminal.

7. The combination as claimed in claim 6 wherein said means responsive to the signal at said first output node for generating and applying a delayed feedback signal to the control electrode of said second transistor includes:

a latch circuit having an input signal node connected to said first signal output node and an output connected to a second node;

inverting means having an input signal node connected to said second node and having an output connected to said control electrode of said second node; and means for applying an operating potential across said latch circuit and said inverting means which is greater in amplitude than the potential applied between said first and second power terminals.

8. The combination as claimed in claim 7 wherein said latch circuit includes an inverter connected between said first signal output node and said second node, and positive feedback means coupling a signal back to said first signal output node for causing said inverter to latch.

9. The combination as claimed in claim 8 wherein said first, second and third transistors are insulated-gate field-effect transistors.

10. The combination comprising:

first, second and third power terminals for the application thereto of first, second, and third different operating voltages, respectively; and wherein said second voltage is intermediate said first and third operating voltages;

a signal input terminal for the application thereto of signals varying in amplitude between said first and said second operating voltages;

first and second transistors of one conductivity type and a third transistor of second conductivity type, each transistor having a conduction path and a control electrode for controlling the conductivity of its conduction path;

a first signal output node;

means connecting the control electrodes of said first and third transistors to said signal input terminal;

means connecting the conduction path of said third transistor between said first signal output node and said first power terminal;

means connecting the conduction paths of said first and second transistors in series between said second power terminal and said first signal output node;

a latch circuit having at least one stable state, said latch having a signal input connected to said first signal output node and having a signal output connected to a second signal output node;

inverting means having a signal input connected to said second signal output node and having an output connected to the control electrode of said second transistor; and means for operatively connecting said latch and said inverting means between said first and third power terminals.

* * * * *